(12) United States Patent
Park et al.

(10) Patent No.: US 7,126,336 B2
(45) Date of Patent: Oct. 24, 2006

(54) NUCLEAR MAGNETIC RESONANCE APPARATUS HAVING A CONTROLLABLE DETECTOR

(75) Inventors: Minseok Park, Hitachinaka (JP); Michiya Okada, Mito (JP); Hiroshi Morita, Mito (JP)

(73) Assignee: Hitachi, Ltd., Tokyo (JP)

( * ) Notice: Subject to any disclaimer, the term of this patent is extended or adjusted under 35 U.S.C. 154(b) by 49 days.

(21) Appl. No.: 10/919,327

(22) Filed: Aug. 17, 2004

(65) Prior Publication Data

US 2005/0099182 A1  May 12, 2005

(30) Foreign Application Priority Data

Nov. 11, 2003 (JP) ............................. 2003-380840

(51) Int. Cl.
G01V 3/00 (2006.01)
(52) U.S. Cl. ........................................ 324/322; 324/318
(58) Field of Classification Search .................. None
See application file for complete search history.

(56) References Cited

U.S. PATENT DOCUMENTS

| | | | |
|---|---|---|---|
| 3,824,451 A * | 7/1974 | Freeman et al. ............. | 324/312 |
| 4,806,868 A | 2/1989 | Schulke | |
| 4,849,886 A * | 7/1989 | Takase ....................... | 600/410 |
| 4,952,877 A * | 8/1990 | Stormont et al. ............ | 324/312 |
| 4,992,736 A * | 2/1991 | Stormont et al. ............ | 324/309 |
| 5,192,910 A | 3/1993 | Hepp et al. | |
| 5,204,625 A * | 4/1993 | Cline et al. .................. | 324/306 |
| 5,280,246 A * | 1/1994 | Takahashi et al. ........... | 324/322 |
| 5,349,296 A * | 9/1994 | Cikotte et al. ............... | 324/309 |
| 5,384,536 A * | 1/1995 | Murakami et al. ........... | 324/309 |
| 5,529,068 A * | 6/1996 | Hoenninger et al. ......... | 600/413 |
| 5,560,361 A * | 10/1996 | Glusick ....................... | 600/410 |
| 5,739,691 A * | 4/1998 | Hoenninger, III ............ | 324/322 |
| 5,754,048 A | 5/1998 | Bielecki | |
| 6,198,283 B1 * | 3/2001 | Foo et al. .................... | 324/309 |
| 6,242,915 B1 * | 6/2001 | Hurd ........................... | 324/309 |
| 6,331,776 B1 * | 12/2001 | Debbins et al. .............. | 324/309 |

(Continued)

FOREIGN PATENT DOCUMENTS

EP  0 692 721  1/1996

OTHER PUBLICATIONS

"Comparisons of Quadrature and Single-Phase Fourier Transform NMR", E. Steiskal et al, Journal of Magnetic Resonance 14, pp. 160-169 (1974).

(Continued)

Primary Examiner—Diego Gutierrez
Assistant Examiner—Tiffany A. Fetzner
(74) Attorney, Agent, or Firm—Antonelli, Terry, Stout and Kraus, LLP

(57) ABSTRACT

In an NMR apparatus having an analog-to-digital converter for converting the voltage signal V(t) to a digital signal, a reference signal generator for generating reference waves which are digital signals, and a quadrature detector for performing a quadrature detection operation, a detection controller for changing a frequency of ωr of the reference waves or a time interval of Δ which is a time interval between data points of digitized NMR signals and also a time interval between data points of the reference waves during detection is installed and furthermore, a storage device for preserving the voltage signal V(t) converted to a digital amount at least until the quadrature detector or the reference signal generator changes the frequency ωr of the reference waves or the time interval Δ is installed between the analog-digital converter and the quadrature detector.

9 Claims, 1 Drawing Sheet

U.S. PATENT DOCUMENTS

| | | | |
|---|---|---|---|
| 6,362,620 B1 * | 3/2002 | Debbins et al. | 324/309 |
| 6,411,093 B1 * | 6/2002 | Schwilch et al. | 324/322 |
| 6,462,544 B1 * | 10/2002 | McKinnon | 324/309 |
| 6,492,812 B1 * | 12/2002 | Debbins et al. | 324/309 |
| 6,566,877 B1 * | 5/2003 | Anand et al. | 324/314 |
| 6,633,162 B1 * | 10/2003 | Zhang et al. | 324/322 |
| 6,650,116 B1 * | 11/2003 | Garwood et al. | 324/309 |
| 6,822,445 B1 * | 11/2004 | Vester | 324/307 |
| 6,844,730 B1 * | 1/2005 | Feld et al. | 324/318 |
| 2001/0015644 A1 * | 8/2001 | Schwilch et al. | 324/307 |
| 2002/0063560 A1 * | 5/2002 | Debbins et al. | 324/307 |
| 2003/0062901 A1 * | 4/2003 | Zhang et al. | 324/322 |
| 2005/0099182 A1 * | 5/2005 | Park et al. | 324/322 |

OTHER PUBLICATIONS

"Digital Quadrature Detection in Nuclear Magnetic Resonance Spectroscopy", L. Gengying et al, Review of Scientific Instruments 70, pp. 1511-1513 (1999).

* cited by examiner

NUCLEAR MAGNETIC RESONANCE APPARATUS HAVING A CONTROLLABLE DETECTOR

CLAIM OF PRIORITY

The present application claims priority from Japanese application serial NO. 2003-380840, filed on Nov. 11, 2003, the content of which is hereby incorporated by reference into this application.

BACKGROUND OF THE INVENTION

The present invention relates to improvement of a nuclear magnetic resonance apparatus having a controllable detector.

Detection of a nuclear magnetic resonance apparatus (hereinafter, abbreviated to NMR) is an operation for fetching a necessary signal from a voltage signal V(t). The voltage signal V(t) is induced to a probe coil by a magnetization vector rotating in a sample. The aforementioned detection operation is performed using a reference wave different from the voltage signal V(t).

The quadrature detection widely used as a detection method duplicates the voltage signal V(t), and multiplies each of them by reference waves $Vr(t)=\cos(\omega rt)$ and $V'r(t)=\sin(\omega rt)$, then filters them, thereby obtains a required signal.

The quadrature detection, for example, is described in Journal of Magnetic Resonance 14, 160 to 169 (1974). The digital quadrature detection obtained by applying a digital art to the quadrature detection to improve the defects thereof, for example, is described in Review of Scientific Instruments 70, 1511 to 1513 (1999).

In a conventional NMR apparatus for realizing the quadrature detection, the frequency $\omega r$ of the reference waves, at least during the execution of the detection operation, must be controlled so as to be kept at a fixed value. On the other hand, in the digital quadrature detection, the time interval $\Delta$ which is the time interval between data points of digitized NMR signals and also the time interval between data points of the reference waves, at least during the execution of the detection operation, is controlled so as to be kept at a fixed value.

In the apparatus for controlling the reference waves so as to keep at the fixed value, to prevent the quality of spectrums which are results of NMR measurements from reduction, various measuring conditions adversely affecting the voltage signal V(t) are also controlled so as to keep at the fixed values. The measuring conditions are, for example, the temperature of samples, the rotational speed of samples, and the static magnetic field intensity (generally called Bo magnetic field) given to samples by a magnet.

These arts, for example, are described In U.S. Pat. No. 5,192,910, U.S. Pat. No. 5,754,048, U.S. Pat. No. 4806868, and European Patent No. 692721. U.S. Pat. No. 5,192,910 discloses controlling the temperature condition constant, U.S. Pat. No. 5,754,048and U.S. Pat. No. 4,806,868 controlling the rotational speed of samples constant, and European Patent No. 692721 controlling the Bo magnetic field constant.

SUMMARY OF THE INVENTION

An object of the present invention, when various measuring conditions adversely affecting the voltage signal V(t) such as the temperature of samples, the rotational speed of samples, and the static magnetic field intensity in samples are changed during measurement, is to provide an NMR apparatus capable of reducing bad effects, such as reduction of the signal to noise ratio and resolution and linear deterioration, to NMR spectrums as which are results of NMR measurements.

One problem solving means of the present invention is that in an NMR apparatus having an analog-to-digital converter for converting the voltage signal V(t) to a digital signal, a reference signal generator for generating reference waves which are digital signals, and a quadrature detector for performing the quadrature detection operation, a detection controller for changing the frequency $\omega r$ of the reference waves or the time interval $\Delta$ which is the time interval between data points of digitized NMR signals and also the time interval between data points of the reference waves during detection is installed and furthermore, a storage device for preserving digital data converted from the voltage signal V(t) at least until the quadrature detector or the reference signal generator changes the frequency $\omega r$ of the reference waves or the time interval $\Delta$ is installed between the analog-digital converter and the quadrature detector.

DETAILED DESCRIPTION OF THE PREFERRED EMBODIMENTS

An embodiment of the present invention will be explained below with reference to the accompanying drawings.

Figure 1:
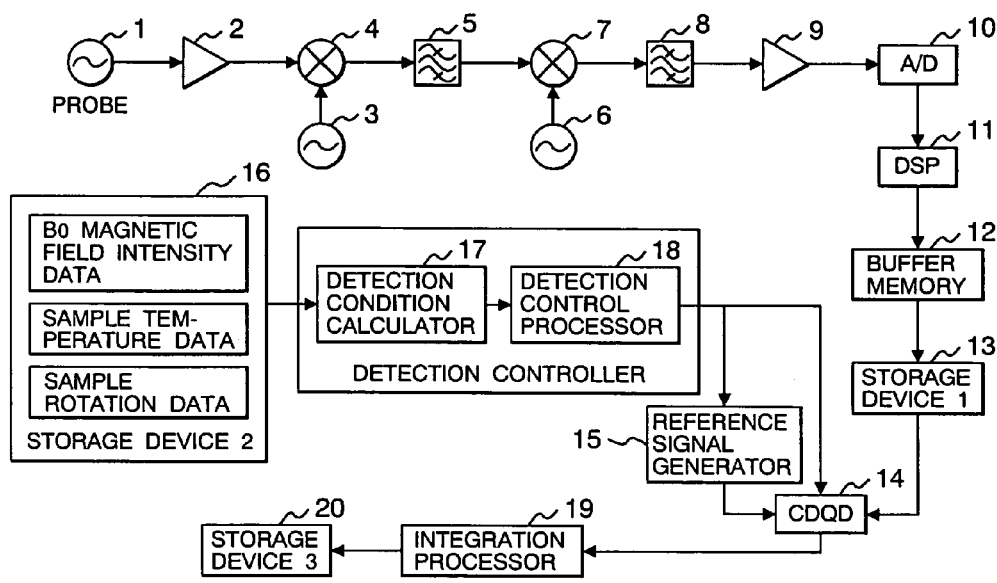
FIG. 1 is a block diagram of an NMR receiver showing an embodiment of the present invention and FIG. 2 is a block diagram showing the constitution for detecting the static magnetic field intensity, sample temperature, and rotation data of a sample.

FIG. 1 is a block diagram showing a, receiver of a nuclear magnetic resonance apparatus which is an embodiment of the present invention. A probe 1 is installed inside a magnet not shown in the drawing and detects a nuclear magnetic resonance signal emitted from a sample to be measured inserted therein.

The nuclear magnetic resonance signal from the probe 1 is amplified by a high frequency amplifier 2, is then sent to a frequency mixer 4, and is mixed with a high frequency sine wave outputted from a high frequency local oscillator 3. A band pass filter 5 passes, among signals outputted from the frequency mixer 4, only the frequency band having the desired first intermediate frequency as a center frequency.

For example, a nuclear magnetic resonance signal having a frequency in the neighborhood of 600 MHz which is detected by the probe 1 is mixed with a sine wave of 621 MHz outputted from the high frequency local oscillator 3 in the frequency mixer 4. Thereafter, the mixed signal passes the band pass filter 5 and is converted to a signal with a frequency band having the first intermediate frequency 21 MHz as a center frequency and a width of 1 MHz.

The signal outputted from the band pass filter 5 is mixed with a high frequency sine wave outputted from an intermediate frequency local oscillator 6 in a frequency mixer 7. Furthermore, the signal passes a band pass filter 8 and is converted to a signal having the desired second intermediate frequency as a center frequency and a desired frequency band. For example, a signal with a width of 1 MHz having the second intermediate frequency 2 MHz as a center frequency is outputted from the band pass filter 8.

The signal outputted from the band pass filter 8 is amplified to a desired voltage by a low frequency amplifier 9 and is converted to a digital signal by an analog-to-digital converter 10. The signal converted to a digital amount is down-sampled and digital-filtered by a digital signal processor 11. The output signal of the digital signal processor 11 is stored in a buffer memory 12 and then is transmitted to and preserved at a first storage device 13 in a data block of a fixes size.

Formula (1) is a formula indicating a signal preserved in the first storage device 13 and it indicates that a signal in which N spectrum peaks whose maximum amplitude, frequency, phase, and transverse relaxation time are respectively Vi, ωi, Φi, and $T_{2,i}$ are overlaid is sampled at intervals of Δ seconds. The signal V(n) is also quantized according to the resolution of the digital-to-analog converter, though it is not related to the contents of the present invention, so that the quantization of V(n) is ignored here.

$$V(n) = \sum_{i=1}^{N} V_i \cos(\omega_i n\Delta + \phi_i) \exp(-n\Delta/T_{2,i}) \quad (1)$$

A controlled digital quadrature detector 14 which is under control by an instruction outputted by a detection control processor 18, executes the digital quadrature detection of the signal read from the first storage device 13 using the reference signal at a frequency of ωr outputted from a reference signal generator 15. The digital band stop filter in the controlled digital quadrature detector 14 changes its setting by the instruction from the detection control processor 18. Formulas (2) and (3) respectively indicate a reference wave and a final signal obtained by the digital quadrature detection.

$$V_r(n) = \cos(\omega_r n\Delta) \quad (2)$$

$$V_s(n) = \sum_{i=1}^{N} V_i \exp(i(\Omega_i n\Delta - \phi_i)) \exp(-n\Delta/T_{2,i}) \quad (3)$$

Here, the frequency Ωi of the final signal is equal to ωr−ωi.

The contents of the instruction outputted from the detection control processor 18, on the basis of the Bo magnetic field intensity data, sample temperature data, and sample rotational speed data which are preserved in a second storage device 16, are decided by the detection conditions calculated by a detection condition calculator 17. The contents of the instruction are parallel shift of all signal frequencies, linear transform of all signal frequencies, and removal of undesired signals having frequencies changing with time.

To shift all signal frequencies Ω1, Ω2, Λ, and Ωn to Ω1+a, Ω2+a, Λ, and Ωn+a in parallel, the detection control processor 18 instructs the reference signal generator 15 so as to convert the reference wave frequency from ωr to ωr+a.

To transform all signal frequencies Ω1, Ω2, Λ, and Ωn to bΩ1, bΩ2, Λ, and bΩn linearly, the detection control processor 18 instructs the controlled digital quadrature detector 14 and the reference signal generator 15 so as to convert Δ to bΔ. The result of this operation, as shown in Formula (4), is a signal whose frequency is linearly transformed.

$$V_s(n) = \sum_{i=1}^{N} V_i \exp(i(\Omega_i n(b\Delta) - \phi_i)) \exp(-n(b\Delta)/T_{2,i}) \quad (4)$$

$$= \sum_{i=1}^{N} V_i \exp(i(b\Omega_i n\Delta - \phi_i)) \exp(-n\Delta/(T_{2,i}/b))$$

On the other hand, as a side effect of conversion, the transverse relaxation time T2,i is changed to T2,i/b. The change of the transverse relaxation time, when b is smaller than 1, widens the spectral lines after the Fourier transformation and deteriorates the resolution. Assuming as b=1+δ, when the linear transverse is executed, the line width is increased to b=1+δ times, while when the linear transverse is not executed, the signal frequency moves by δ×d due to measuring condition changes. Therefore, whether or not to execute the linearly transverse must be decided after the aforementioned side effect is evaluated.

It is well known that when the Bo magnetic field or sample temperature is changed, the nuclear magnetic resonance signal frequency is linearly varied and to correct the linear variation, the aforementioned linear transform and parallel shift can be used. To remove an unnecessary signal having a frequency changing with time, the detection control processor 18 instructs the controlled digital quadrature detector 14 so as to change the center frequency of the built-in digital band stop filter.

For example, when measuring a nuclear magnetic resonance signal of a sample rotating in a non-uniform Bo magnetic field, the sample rotation acts as a magnetic field modulation. This rotation-induced magnetic field modulation causes an unnecessary signal called a spinning side band which appears together with the nuclear magnetic resonance signal. The frequency of the above mentioned spinning side band depends on the rotational speed of the sample, so that it varies with variations of the rotational speed of the sample. As the rotational speed varies, the center frequency of the digital band stop filter is changed, thus the nuclear magnetic resonance signal spectrum is prevented from deterioration due to variations in the spinning side band frequency.

The detection control processor 18, when the measuring condition data preserved in the second storage device 16 varies beyond a predetermined allowable limit value, may cancel the process for the signal data preserved in the first storage device. A signal detected by the controlled digital quadrature detector 14 is integrated by an integration processor 19 and is preserved in a third storage device 20.

Figure 2:
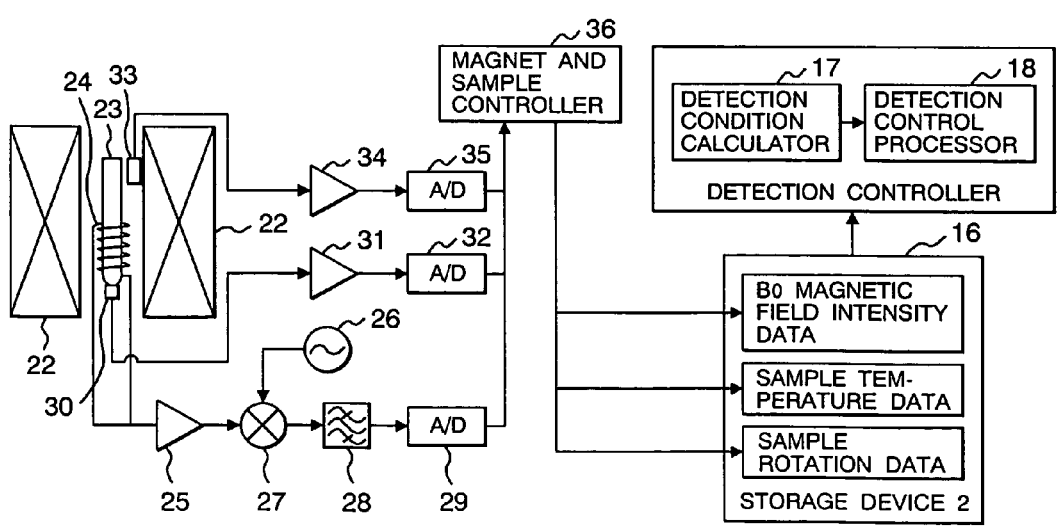

FIG. 2 is a block diagram showing the constitution for detecting the static magnetic field intensity, sample temperature, and rotation data of a sample. A sample held in a sample tube 23 is rotated by a device not shown in the drawing in the static magnetic field generated by a magnet 22. At that time, the static magnetic field intensity is detected by measuring a nuclear magnetic resonance signal of which frequency is already known by a detection coil 24. The nuclear magnetic resonance signal is input to a frequency mixer 27 via a high frequency amplifier 25.

The frequency mixer 27 mixes the rotation of the sample with a high frequency sine wave from a high frequency local oscillator 26. The band pass filter 28 passes only frequencies having a desired frequency as a center frequency among output signals from the frequency mixer. A signal outputted from a band pass filter 28 is converted to a digital signal by an analog-to-digital converter 29 and then is supplied to a magnet sample controller 36.

The sample temperature is supplied to the magnet sample controller 36 via a temperature detector 30, an amplifier 31, and an analog-to-digital converter 32.

Furthermore, the rotational speed of the sample is supplied to the magnet sample controller 36 via a rotational speed detector 33, an amplifier 34, and an analog-to-digital converter 35. The magnetic field intensity data, sample temperature data, and sample rotation data which are detected in this way are stored in the second storage device 16. These data, as explained in FIG. 1, are sent to the detection condition calculator 17 and the detection control processor 18.

According to the NMR receiver of the present invention, the parallel shift of the nuclear magnetic resonance signal frequency caused by variations in the Bo magnetic field intensity and variations in the sample temperature during measurement and the linear transform of the chemical shift can be corrected. Further, the nuclear magnetic resonance signal spectrum can be prevented from deterioration caused by frequency variations of the spinning side band due to variations in the sample rotational speed.

The Bo magnetic field, sample temperature, and sample rotational speed may be varied unintentionally or may be changed intentionally for the purpose of improvement of the resolution and measurement throughput.

According to the aforementioned constitution, a signal can be detected by changing the frequency ωr of the reference waves or the time interval Δ between the digital data and when the digital NMR signals and reference waves are properly changed, the bad effect of variations in the measuring conditions on the NMR spectrum can be reduced.

What is claimed is:

1. A nuclear magnetic resonance apparatus comprising:
   an amplifier amplifying an analog NMR signal received by a detection probe;
   an analog-to-digital converter converting said analog NMR signal amplified by said amplifier to a digital NMR signal;
   a quadrature detector;
   a first storage device installed between the analog-to-digital converter and said quadrature detector configured for preserving said digital NMR signal;
   a second storage device configured for preserving NMR measuring conditions including a magnetic field intensity data, a sample temperature data, and a sample rotation data under NMR measurement;
   a detection controller reading said NMR measuring conditions from said second storage device and controlling a detection operation; and
   a reference signal generator outputting a reference wave for detection according to an instruction of said detection controller;
   wherein said quadrature detector reads said digital NMR signal preserved in said first storage device and performs quadrature detection using a reference signal outputted from said reference signal generator according to said instruction of said detection controller.

2. A nuclear magnetic resonance apparatus having a controllable detector according to claim 1, wherein a frequency converter configured for changing a frequency of said analog NMR signal is installed between said detection probe and said analog-to-digital converter.

3. A nuclear magnetic resonance apparatus having a controllable detector according to claim 1, wherein a buffer memory that improves data transmission efficiency is installed between said analog-to-digital converter and said first storage device.

4. A nuclear magnetic resonance apparatus having a controllable detector according to claim 3, wherein in order to improve a signal-to-noise ratio and said data transmission efficiency, a digital signal processor configured for at least executing digital filtering, down sampling, and decimation is installed between said analog-to-digital converter and said buffer memory.

5. A nuclear magnetic resonance apparatus having a controllable detector according to claim 1, wherein said detection controller is composed of a detection condition calculator that reads said NMR measuring conditions from said second storage device and calculates appropriate detection conditions, and a detection control processor that uses said calculated detection conditions and sends an instruction to both said quadrature detector and said reference signal generator.

6. A nuclear magnetic resonance apparatus having a controllable detector according to claim 1, wherein said quadrature detector is implemented as software operating on a general-purpose computer.

7. A nuclear magnetic resonance apparatus having a controllable detector according to claim 1, wherein said quadrature detector is capable of changing a time interval between data points of said digital NMR signal read from said first storage device by said instruction of said detection controller.

8. A nuclear magnetic resonance apparatus having a controllable detector according to claim 1, wherein said reference signal generator, by said instruction of said detection controller, is capable of changing both a frequency of said reference wave to be outputted and said time interval between said data points.

9. A nuclear magnetic resonance apparatus having a controllable detector according to claim 1, wherein said quadrature detector has a built-in digital band stop filter whose center frequency is capable of being changed by said instruction of said detection controller.

* * * * *